(12) United States Patent
Muraoka

(10) Patent No.: US 7,659,752 B2
(45) Date of Patent: Feb. 9, 2010

(54) NOISE FILTER CIRCUIT

(75) Inventor: Daisuke Muraoka, Chiba (JP)

(73) Assignee: Seiko Instruments Inc., Chiba (JP)

( * ) Notice: Subject to any disclaimer, the term of this patent is extended or adjusted under 35 U.S.C. 154(b) by 103 days.

(21) Appl. No.: 11/521,674

(22) Filed: Sep. 14, 2006

(65) Prior Publication Data

US 2007/0066266 A1    Mar. 22, 2007

(30) Foreign Application Priority Data

Sep. 21, 2005    (JP) .............................. 2005-273752

(51) Int. Cl.
*G01R 29/02* (2006.01)
*H03K 5/1252* (2006.01)

(52) U.S. Cl. ........................................ 327/34; 327/552

(58) Field of Classification Search ......... 327/551–553, 327/558, 34; 331/15–17; 326/30
See application file for complete search history.

(56) References Cited

U.S. PATENT DOCUMENTS

| | | | | |
|---|---|---|---|---|
| 4,686,483 A | * | 8/1987 | Isshiki et al. ................. | 327/552 |
| 4,716,318 A | * | 12/1987 | Koike ........................... | 327/558 |
| 4,875,130 A | * | 10/1989 | Huard ........................... | 361/56 |
| 5,198,710 A | * | 3/1993 | Houston ........................ | 327/552 |
| 5,821,793 A | * | 10/1998 | Ohta et al. .................... | 327/277 |
| 6,608,508 B1 | * | 8/2003 | Iwaguro et al. .............. | 327/142 |
| 2002/0113643 A1 | * | 8/2002 | La Rosa ........................ | 327/551 |
| 2003/0229466 A1 | * | 12/2003 | Garcia .......................... | 702/117 |

FOREIGN PATENT DOCUMENTS

JP    06-132791    5/1994

* cited by examiner

*Primary Examiner*—Lincoln Donovan
*Assistant Examiner*—Colleen O'Toole
(74) *Attorney, Agent, or Firm*—Brinks Hofer Gilson & Lione

(57) ABSTRACT

Provided is a noise filter circuit capable of outputting only a normal signal pulse in synchronization with a clock signal without passing the noise pulse on to a subsequent stage, even if a noise pulse having a width that is larger than a delay time is inputted. The noise filter circuit according to the present invention has a flip-flop additionally provided to a stage subsequent to a noise removing circuit that uses a delay circuit. The delay time of a clock signal inputted to the flip-flop is made different from the delay time of the noise removing circuit to thereby obtain a normal signal pulse to be outputted in synchronization with the clock signal.

10 Claims, 3 Drawing Sheets

NOISE FILTER CIRCUIT

This application claims priority under 35 U.S.C. § 119 to Japanese Patent Application No. JP2005-273752 filed Sep. 21, 2005, the entire content of which is hereby incorporated by reference.

BACKGROUND OF THE INVENTION

1. Field of the Invention

The present invention relates to a circuit for outputting only a normal signal pulse by removing a noise signal.

2. Description of the Related Arts

As illustrated in FIG. 2, in a conventional noise removing circuit for removing noise from a digital signal, an input signal is branched into two signals: a signal to be inputted to a gate circuit (corresponding to an AND gate circuit 16 of FIG. 2) and a signal to be inputted to a delay circuit 15. The delay circuit 15 delays the input signal to output the delayed signal, and the delayed signal is inputted to the gate circuit. The gate circuit performs calculation to obtain a logical multiplication or a logical addition (a logical multiplication is obtained in FIG. 2) of the two inputs, and outputs the result.

The delay circuit 15 delays the input signal by an amount larger than the width of a noise pulse, and the delayed signal is inputted to the AND gate circuit 16. The AND gate circuit 16 obtains a logical multiplication of the input signal and the input signal delayed by the delay circuit to thereby remove a noise pulse. The AND gate circuit 16 then makes the trailing edges of signal components of the input signals to be in phase with each other to generate a final output signal (see, for example, JP 06-132791 A).

However, in application of such the conventional noise removing circuit there is a problem in that, when a noise pulse inputted has a width that is equal to or larger than a delay time of the delay circuit, a noise pulse having such a width can not be removed and allowed to be passed along with a normal signal pulse.

Further, the pulse width of an output signal outputted from such the conventional noise removing circuit has a pulse width corresponding to a pulse width obtained by eliminating the delay time from an output signal, which leads to another problem in that it is difficult to make the signal in phase with a clock signal in a subsequent stage.

SUMMARY OF THE INVENTION

In order to solve the above-described problems, the present invention provides a noise filter circuit with a flip-flop additionally provided to a stage subsequent to a noise removing circuit which uses a delay circuit, in which the delay time of a clock signal to be inputted to the flip-flop is made different from the delay time of the noise removing circuit, to thereby make a normal signal pulse to be synchronized with the clock signal.

According to the noise filter circuit of the present invention, even if a noise pulse having a width larger than a delay time is inputted, the noise pulse is prevented from being passed on to a subsequent stage unless the noise pulse is in synchronization with a leading edge or a trailing edge of a clock signal in the flip-flop in the subsequent stage. Accordingly, only a normal signal pulse can be outputted in synchronization with a clock signal.

DESCRIPTION OF THE PREFERRED EMBODIMENTS

Figure 1:
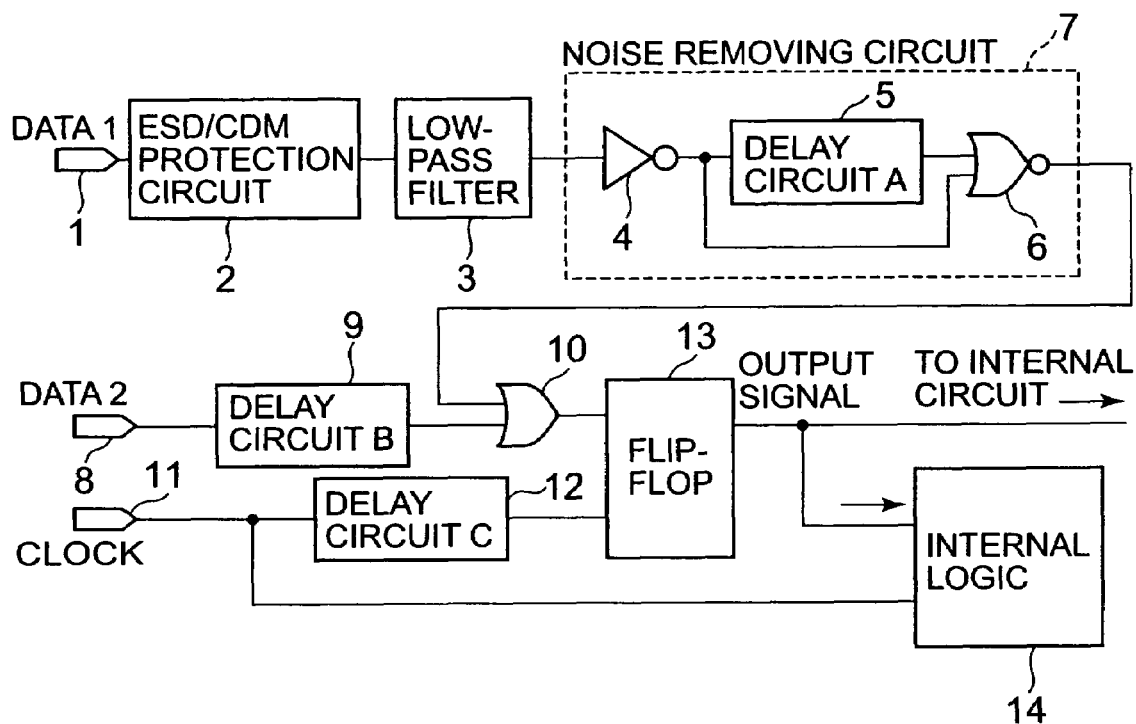
FIG. 1 is a circuit diagram of a noise filter circuit according to the present invention.
Figure 2:
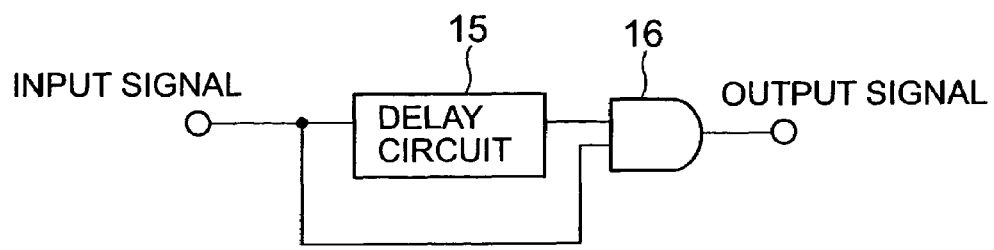
FIG. 2 is a circuit diagram of a conventional noise removing circuit.
Figure 5:
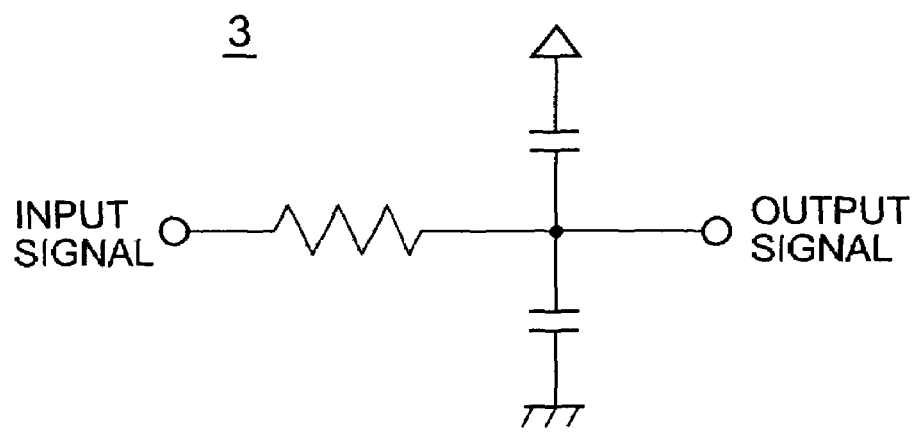
FIG. 5 is a circuit diagram of a low-pass filter used in the noise filter circuit according to the embodiment of the present invention.

An embodiment of the present invention is now described in detail in the following with reference to the accompanying drawings. FIG. 1 is a circuit diagram of a noise filter circuit according to the present invention. The noise filter circuit includes: a first signal input terminal 1; a noise removing circuit 7 for receiving a signal inputted from the first signal input terminal 1 through an ESD/CDM protection circuit 2 and a low-pass filter 3; a clock input terminal 11; a second delay circuit 12 for delaying a signal inputted from the clock input terminal 11; a second signal input terminal 8; a third delay circuit 9 for delaying a signal inputted from the second signal input terminal 8; an OR gate circuit 10 for receiving a signal inputted from the noise removing circuit 7 and a signal from the third delay circuit 9; and a flip-flop 13 for receiving a signal inputted from the OR gate circuit 10 and a clock from the second delay circuit 12. The noise removing circuit 7 includes, for example: an inverter circuit 4 for inverting a signal inputted from the low-pass filter 3; a first delay circuit 5 for delaying a signal inputted from the inverter circuit 4; and a NOR gate circuit 6 for receiving a signal inputted from the inverter circuit 4 and a signal inputted from the first delay circuit 5. Alternatively, as illustrated in FIG. 2, the noise removing circuit 7 may include: the first delay circuit 5 for delaying a signal inputted from the low-pass filter 3; and an AND gate circuit 16 for receiving a signal inputted from the low-pass filter 3 and a signal inputted from the first delay circuit 5. The low-pass filter 3 is, for example, formed of a circuit illustrated in FIG. 5.

The low-pass filter 3 removes a high frequency noise component from the signal inputted from the first signal input terminal 1. The noise removing circuit 7 removes a noise pulse having a width that is smaller than a delay time of the delay circuit 5. The flip-flop 13 in a subsequent stage outputs the signal in synchronization with a clock delayed by the second delay circuit 12.

Figure 3:
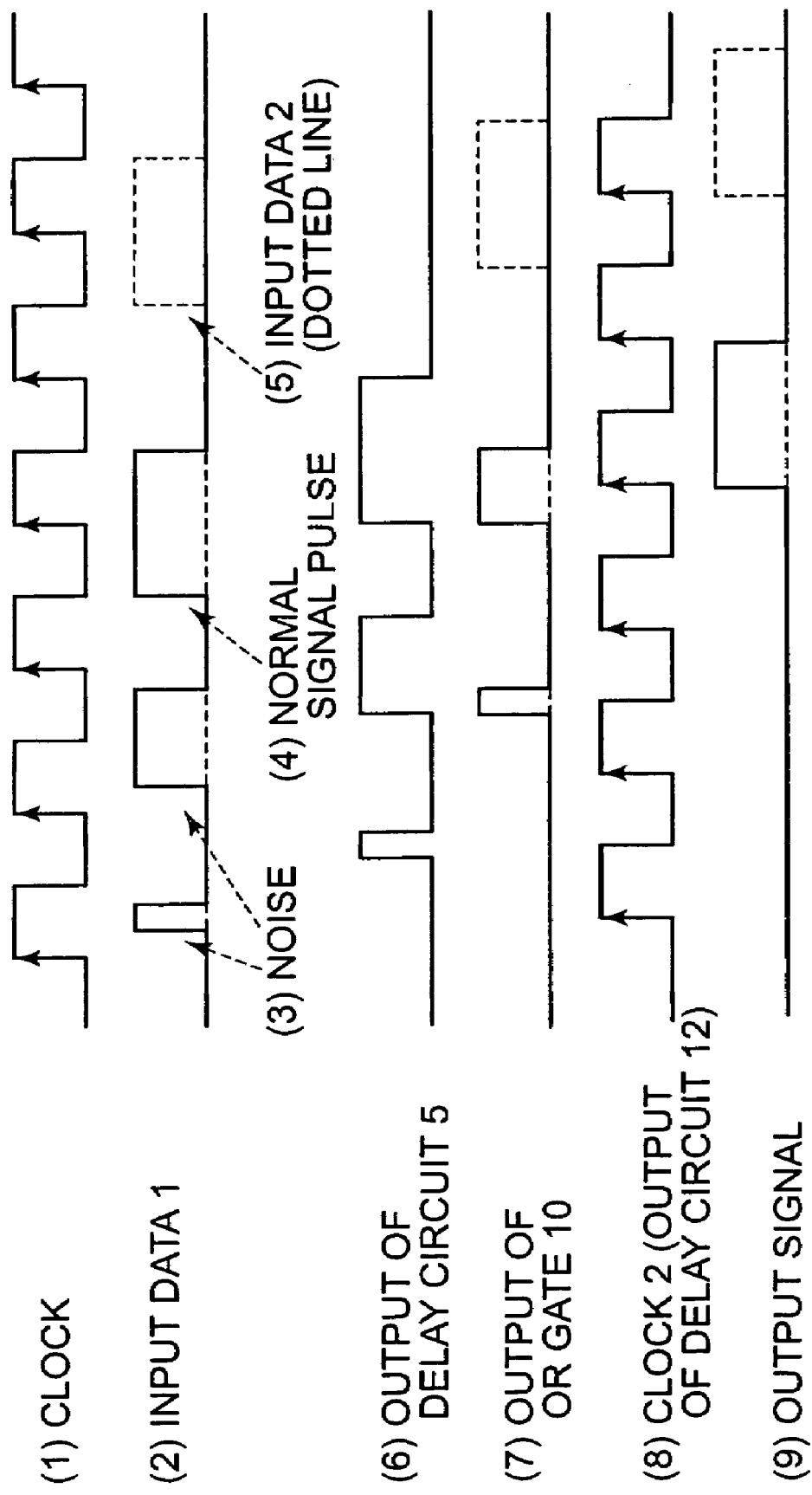
FIG. 3 is a timing chart of the noise filter circuit according to the present invention.

The noise filter circuit according to the present invention is described in the following with reference to a timing chart of FIG. 3.

First, considered is a case where a noise and a normal pulse signal illustrated as input data 1 are inputted to the first signal input terminal 1. The signal of the input data 1 passes through the inverter circuit 4 to be branched into two signals, one of the two signals is directly inputted to the NOR gate circuit 6; and the other of the two signals is inputted to the NOR gate circuit 6 through the delay circuit 5. The signal outputted from the NOR gate circuit 6 is a signal from which a noise pulse having a width that is smaller than the delay time of the delay circuit 5 is removed (output of the OR gate 10). To be more specific, the output signal of the OR gate 10 is a signal having a width that is smaller than that of the signal waveform of the input data 1 by the delay time of the delay circuit 5, and having the same phase as that of the signal waveform of the input data 1. As for a noise pulse having a width that is equal to or larger than the delay time of the delay circuit 5, a noise pulse having a width that is smaller by the delay time is outputted to the subsequent stage.

A signal from the OR gate circuit 10 is inputted to the flip-flop 13. The flip-flop 13 is a circuit structured to maintain the input data when a clock rises, until the next leading edge. When a pulse signal having a width of one clock is inputted through the flip-flop, a leading edge of a clock signal is usually set to the center of the input signal pulse so as to output a pulse with stability. A portion of the width of a normal signal pulse which has passed through the noise removing circuit 7 is eliminated from a leading edge side by the amount of the delay time. Therefore, a clock signal to be inputted to the flip-flop 13 is required to be delayed by using the second delay circuit 12, with consideration given to the eliminated pulse width. In this case, the delay time of the clock signal may be set according to the following equation:

(the delay time of the clock signal)=(the delay time of the noise removing circuit)/2    (1)

When delays other than the delay time of the noise removing circuit (delays due to the low-pass filter, wiring resistance, and parasitic capacitance) are taken into consideration, the delay time of the clock signal may be set according to the following equation:

(the delay time of the clock signal)=(the delay time of the noise removing circuit)/2+(the total of the other delay times)    2)

In this way, a noise which could not be removed by the noise removing circuit 7 is removed, and a normal signal pulse is outputted with stability in synchronization with the delayed clock signal.

Next, considered is a case where a normal signal pulse (a pulse signal illustrated by the dotted line) illustrated as input data 2 is inputted from the second signal input terminal 8.

The normal signal pulse is inputted directly to the flip-flop without being passed through the noise removing circuit 7. Accordingly, by delaying the signal pulse by the same time period as that of a clock signal, by using the third delay circuit 9 (to obtain a pulse signal illustrated by a dotted line in the output of the OR gate 10), a synchronized signal can be outputted from the flip-flop with stability.

Further, due to a structure where a clock signal to be inputted from the clock input terminal 11 as a clock to be used in logics other than the flip-flop 13 is directly inputted without being passed through a delay circuit, internal logics other than the flip-flop operate in synchronization with a clock signal inputted from the clock input terminal 11. That is, the internal logics other than the flip-flop 13 operate in synchronization with a clock signal inputted from the outside, which makes it possible to prevent unnecessary noises from being generated due to out-of-phase clock signals as compared with a case of using a clock that is purposely delayed inside.

Figure 4:
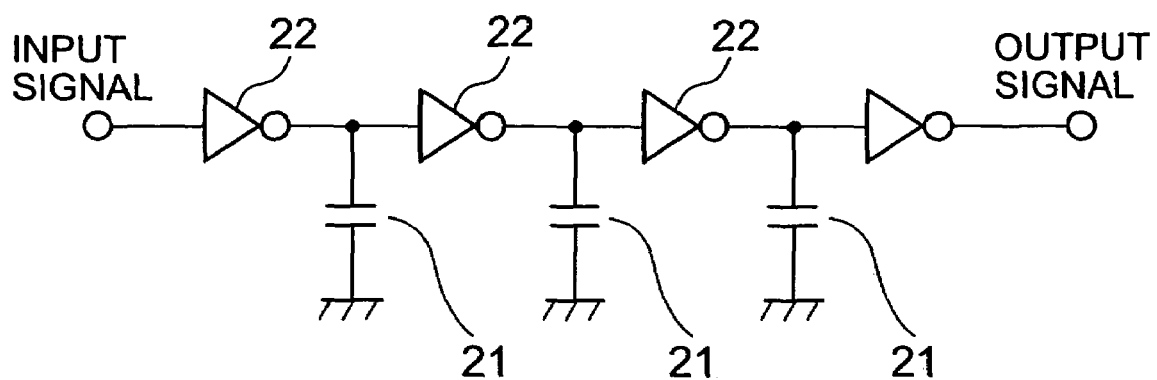
FIG. 4 is a circuit diagram of a delay circuit used in the noise filter circuit according to an embodiment of the present invention.

FIG. 4 illustrates an exemplary circuit diagram of a delay circuit used in the noise filter circuit according to this embodiment. Due to a structure where the capacitance of each capacitor 21 or the channel resistance of a transistor in each inverter 22 in the stages preceding to the capacitors (based on the gate length and the gate width) can be made variable by trimming or optional switching of polysilicon/aluminum, the delay time can be adjusted as desired.

Further, the noise filter circuit according to this embodiment includes the ESD/CDM protection circuit provided at the first signal input terminal 1 or the second signal input terminal 8, which prevents problems from being caused when sudden surge is inputted from the terminals or when electric charge accumulates in a node of the input terminals that are in a floating state.

Further, the noise filter circuit according to this embodiment has a configuration where the low-pass filter 3 is replaced with a Schmitt trigger circuit or a Schmitt trigger circuit is additionally provided in a stage subsequent to the low-pass filter 3 to thereby prevent chattering when a signal pulse of the first signal input terminal 1 rises or falls.

What is claimed is:

1. A noise filter circuit, comprising:
    a noise removing circuit having a first delay circuit configured to delay an input signal for a first delay time such that the noise removing circuit removes from the input signal a noise signal with a time duration shorter than the first delay time;
    a second delay circuit configured to delay a clock signal for a second delay time, wherein the clock signal oscillates with a constant frequency independent from the input signal, and the second delay time is a half of the first delay time; and
    a flip-flop triggered by the delayed clock signal to hold an output signal of the noise removing circuit for at least one cycle of the delayed clock signal, wherein the first and second delay times are set so as to remove from the output signal of the noise removing circuit a noise signal which had a time duration at least as long as the first delay time and was not removed by the noise removing circuit and to restore at least some of a signal length of an input signal lost in the noise removing circuit.

2. A noise filter circuit according to claim 1, further comprising a low-pass filter in a stage preceding the noise removing circuit.

3. A noise filter circuit according to claim 1, further comprising a structure in which a logic clock is directly inputted to an internal logic without being passed through the second delay circuit.

4. A noise filter circuit according to claim 1, further comprising a third delay circuit configured to delay a second input signal for the second delay time and output the delayed input signal to the flip-flop.

5. A noise filter circuit according to claim 4, wherein any of the first, second and third delay circuits is configured to effect a variable delay time.

6. A noise filter circuit according to claim 1, wherein the noise removing circuit is replaced with a low-pass filter.

7. A noise filter circuit according to claim 4, wherein the first or the second input signal data passes through an ESD/CDM protection circuit as a first stage.

8. A noise filter circuit according to claim 2, wherein the low-pass filter is replaced with a Schmitt trigger circuit, or a Schmitt trigger circuit is additionally provided in a stage subsequent to the low-pass filter.

9. A noise filter circuit as claimed in claim 1, wherein:
    the noise removing circuit comprises:
    an inverter circuit;
    the first delay circuit connected to the inverter circuit;
    a NOR gate circuit; and
    and the inverter circuit and the first delay circuit each have an output inputted to the NOR gate circuit.

10. A noise filter circuit as claimed in claim 1, wherein the second delay time is the half of the first delay time optionally added with a delay time incurred by the input signal along a signal path to the flip-flop.

* * * * *